US009373952B2

(12) United States Patent
O'Regan et al.

(10) Patent No.: US 9,373,952 B2
(45) Date of Patent: Jun. 21, 2016

(54) LOW FAULT CURRENT ISOLATOR SYSTEM

(71) Applicant: Electrical Materials Company, Genoa City, WI (US)

(72) Inventors: Timothy M. O'Regan, Chicago, IL (US); Timothy J. O'Regan, Park Ridge, IL (US); Thomas Hayes, Highlands Ranch, CO (US); Kevin J. Severson, Janesville, WI (US)

(73) Assignee: Electrical Materials Company, Genoa City, WI (US)

( * ) Notice: Subject to any disclaimer, the term of this patent is extended or adjusted under 35 U.S.C. 154(b) by 0 days.

(21) Appl. No.: 14/735,267

(22) Filed: Jun. 10, 2015

(65) Prior Publication Data

US 2015/0280418 A1    Oct. 1, 2015

Related U.S. Application Data

(62) Division of application No. 13/915,102, filed on Jun. 11, 2013, now Pat. No. 9,136,692.

(51) Int. Cl.
*H02H 3/10* (2006.01)
*H01H 85/041* (2006.01)
*H01H 85/38* (2006.01)
*G01R 1/04* (2006.01)
(Continued)

(52) U.S. Cl.
CPC .. *H02H 3/10* (2013.01); *G01R 1/04* (2013.01); *G01R 1/0408* (2013.01); *G01R 31/026* (2013.01); *H01H 85/041* (2013.01); *H01H 85/38* (2013.01); *H01R 13/05* (2013.01); *H01R 13/71* (2013.01); *H02H 1/0092* (2013.01); *H02H 3/093* (2013.01); *H02H 7/28* (2013.01); *G01R 22/065* (2013.01)

(58) Field of Classification Search
CPC ....... H02H 1/0092; H02H 3/093; H02H 3/10; H02H 7/28; H01H 85/041; H01H 85/38; H01R 13/05; H01R 13/71; G01R 1/04; G01R 1/0408; G01R 22/065; G01R 31/026
USPC ........................................................ 361/87
See application file for complete search history.

(56) References Cited

U.S. PATENT DOCUMENTS 2,383,327 A    8/1945    Ludwig et al.
3,662,118 A    5/1972    Phoenix
(Continued)

*Primary Examiner* — Thienvu Tran
*Assistant Examiner* — Kevin J Comber
(74) *Attorney, Agent, or Firm* — Greer, Burns & Crain, Ltd.

(57) ABSTRACT

A low fault current isolation arrangement senses a loss of voltage and automatically isolates and de-energizes a down live primary wire if overcurrent protection devices have not cleared the high impedance fault in an electric power distribution network. Incorporating an operator selectable time delay response, the low fault current isolation arrangement permits overcurrent protection devices to attempt to detect and shut down the affected conductor, and then isolates and shuts down the low current fault if the overcurrent devices are not successful. The isolation arrangement continuously monitors AC voltage as remotely provided by smart meters even after a fault location is de-energized, and serves as a back up, and not as a replacement, for existing overcurrent protection schemes. A host computer operates in conjunction with plural smart meters each coupled to an associated customer distribution transformer in conjunction with the fault isolator to detect and shut down high impedance faults.

18 Claims, 11 Drawing Sheets

(51) Int. Cl.
*H02H 3/093* (2006.01)
*H02H 1/00* (2006.01)
*H02H 7/28* (2006.01)
*G01R 31/02* (2006.01)
*H01R 13/05* (2006.01)
*H01R 13/71* (2006.01)
*G01R 22/06* (2006.01)

(56) References Cited

U.S. PATENT DOCUMENTS

| | | | |
|---|---|---|---|
| 4,045,762 A * | 8/1977 | Foulkes | H01H 39/004 200/61.08 |
| 4,313,146 A | 1/1982 | Lee | |
| 4,546,309 A | 10/1985 | Kang et al. | |
| 4,851,782 A | 7/1989 | Jerrings et al. | |
| 4,878,142 A | 10/1989 | Bergman et al. | |
| 4,916,628 A | 4/1990 | Kugler | |
| 5,012,510 A | 4/1991 | Schaubs et al. | |
| 5,025,470 A | 6/1991 | Thornborough et al. | |
| 5,185,705 A | 2/1993 | Farrington | |
| 5,341,265 A * | 8/1994 | Westrom | H02H 1/0015 361/44 |
| 5,385,486 A | 1/1995 | Robinson et al. | |
| 5,495,384 A | 2/1996 | Wallis et al. | |
| 5,550,751 A | 8/1996 | Russell | |
| 5,602,709 A | 2/1997 | Al-Dabbagh | |
| 5,734,575 A | 3/1998 | Snow et al. | |
| 5,784,441 A | 7/1998 | Davis et al. | |
| 5,883,882 A | 3/1999 | Schwartz | |
| 6,059,605 A | 5/2000 | Robinson et al. | |
| 6,292,340 B1 | 9/2001 | O'Regan | |
| 7,479,029 B2 | 1/2009 | Cook et al. | |
| 8,168,901 B2 * | 5/2012 | Haj-Maharsi | H01H 31/127 200/48 R |
| 2003/0011486 A1 | 1/2003 | Ying | |
| 2006/0258204 A1 | 11/2006 | Preuhs et al. | |
| 2011/0026500 A1 | 2/2011 | Shaffer et al. | |
| 2013/0027818 A1 | 1/2013 | McGrail | |

* cited by examiner

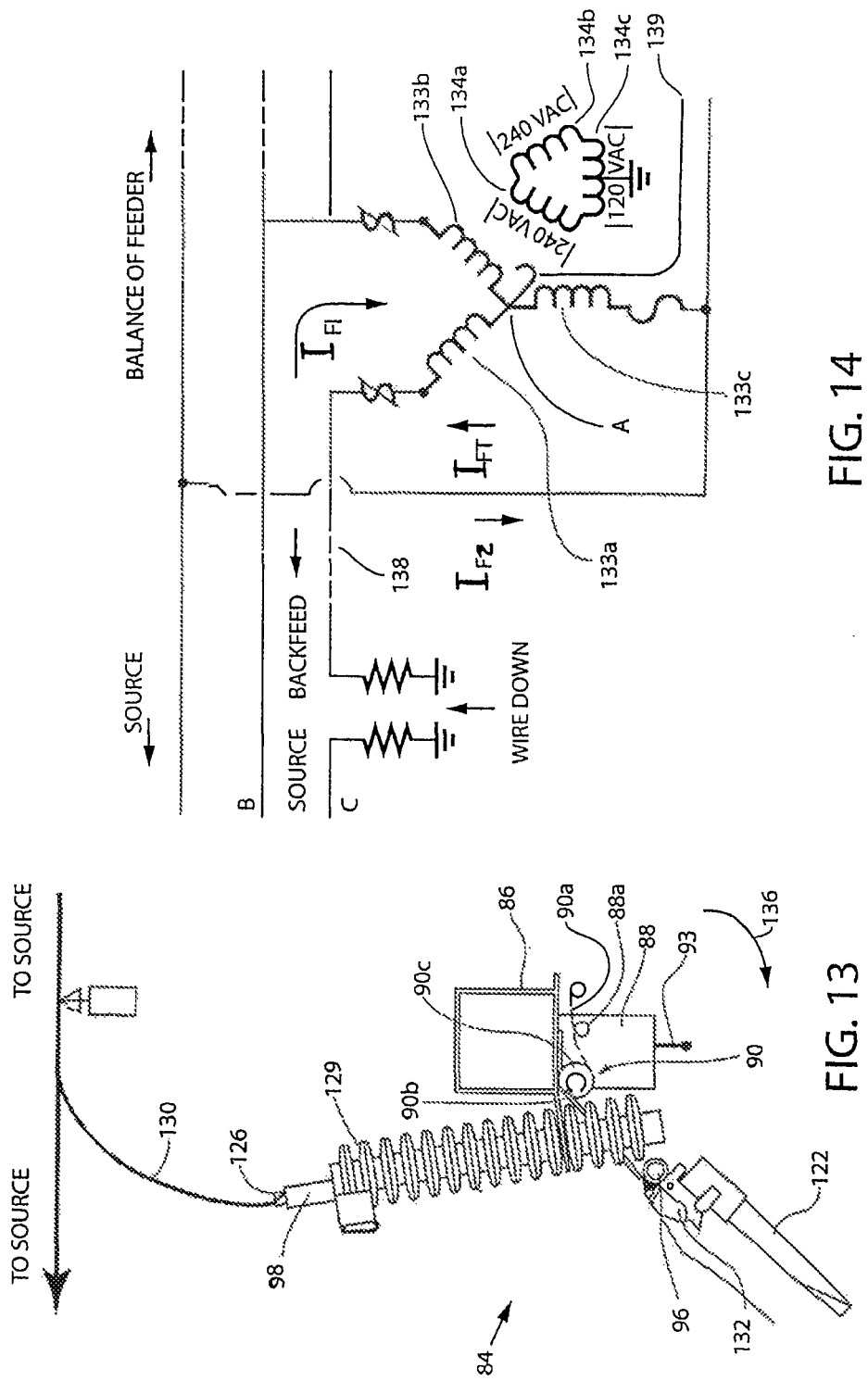

LOW FAULT CURRENT ISOLATOR SYSTEM

This application is a Divisional of U.S. patent application Ser. No. 13/915,102, filed Jun. 11, 2013.

FIELD OF THE INVENTION

This invention relates generally to apparatus for sensing, isolating and de-energizing a downed alternating current electric utility primary distribution circuit conductor which has developed into a high impedance fault which overcurrent protection devices or high impedance detection systems have been unable to clear. This type of high impedance fault condition may also occur when a high voltage conductor is down and grounded via a high impedance primary ground producing backfeed through a common connection of three single phase transformers. In this latter situation, the three single phase transformer windings of different phases are the source of a low level backfeed fault current and high voltage on the downed conductor.

This invention also relates to an adapter for mounting an out-of-service electric utility watthour meter to a disconnected customer's electric meter socket, where the meter remains source side energized to continue carrying out off-line meter functions and facilitate verification that unauthorized electric power is not being consumed.

This invention further contemplates an electrical safety device capable of remote operation which is intended to extend the fault clearing capability of existing expulsion fuse devices and which is capable of automatically clearing high voltage faults in the presence of a high fault current. The inventive electrical safety device includes a spring-loaded, low cost, remotely controlled grounding device disposed on the load side of an overhead pole mounted fuse holder which provides a low impedance path in parallel with the downed faulted conductor for clearing the hazardous condition.

BACKGROUND OF THE INVENTION

High impedance, low current faults, such as a downed distribution line conductor in an electric utility distribution network which is contacting a poor conductive earth composite, have proven to be difficult to isolate with present technology. Conventional overcurrent protection devices, both at the source and at strategic circuit locations, use the combined measurement of fault current magnitude and time duration to clear faults associated with downed grounded high voltage conductors. A particularly difficult situation for detecting a high impedance fault in an electrical distribution system involves a live conductor downed, but intact, and grounded through a poor conducting medium such as sand, rock, concrete, snow, blacktop or a tree. For reliability purposes, it is common practice to install downstream circuit reclosers, expulsion fuses or sectionalizers at all taps to the main stem distribution circuit. These protection devices serve to locally isolate downed fault conductors in the smallest sections possible, yet maintain normal service to the balance of customers on that same circuit. These downstream overcurrent protection devices are designed to be time coordinated with each other and a main circuit breaker in order to automatically isolate the downed primary conductor. Overcurrent protection devices are, however, unable to distinguish low fault currents (high impedance faults) from normal load currents because trip settings for these devices are typically set at 125 to 250 percent of maximum estimated peak load current. These current levels are selected to minimize inadvertent tripping. A hazardous condition for the public is created when energized high voltage conductors fall to the ground or come in contact with a high impedance return path, and the overcurrent protection system fails to de-energize the conductor. Physical contact with an energized distribution primary conductor by any conducting body may cause serious injury or death due to electric shock. Numerous fatalities and serious injuries occur annually in the United States due to inadvertent contact with live down power distribution conductors. Experience has shown that these conditions occur more frequently at distribution level voltages of 15 KV and below, which is the predominant primary distribution voltage range in the United States.

Referring to FIG. 1, there is shown a simplified schematic diagram of a prior art high impedance fault sensing arrangement. An overhead distribution primary circuit 10 includes a substation bus 28 which is energized by a substation transformer 36 which is connected to the substation bus via a substation transformer breaker 34. Coupled to and extending from the substation bus 28 are plural branch tap circuits, each coupled to the substation bus by means of a respective distribution feeder breaker. Thus, two distribution feeder breakers are shown in FIG. 1 as elements 32a and 32b, with a third main overcurrent relay-circuit breaker combination shown as element 18 in the figure. The overhead distribution primary circuit 10 is subject to the occurrence of a low current, high impedance fault 12 on a branch tap 16 which is not detectable by a circuit recloser 14 or by the main overcurrent relay-circuit breaker combination 18. Branch tap 16, which is similar to other branch taps connected to distribution feeder breakers 32a and 32b, also includes plural distribution transformers 30a, 30b and 30c, and is shown experiencing the low current, high impedance fault 12, such as broken or downed conductor 29. A high impedance detection arrangement 20 coupled to the overhead distribution primary circuit 10 by means of a transducer 22 receives generated signals through the transducer. These signals are conditioned and compared by a microprocessor 24 with a stored signal pattern which is characteristic of normal system operation. A microcomputer 26 coupled to the microprocessor 24 as well as to the main overcurrent relay-circuit breaker combination 18 makes a trip/output decision based upon several operating parameters which are weighted. While the arrangement shown in FIG. 1 is designed for detection and shutdown of high voltage (low impedance) faults involving large currents, it is incapable of detecting and isolating low current high impedance faults. A low fault current isolator system is needed to permit electrical utilities to detect a high impedance fault characterized by a very low fault current to minimize the time period that a downed wire remains alive, after an overcurrent protection device has failed to de-energize the downed live wire.

The present invention overcomes the aforementioned limitations of the prior art by sensing the combination of loss of voltage on the load side of a downed conductor and live voltage on the source side of the downed wire. This downed wire constitutes a very high impedance fault characterized by a limited fault current typically below the tripping value of the associated fault isolating device. The detection, isolation and de-energization of the downed or damaged live conductor is analyzed and controlled by a host computer through remote tripping of an associated isolation device. This process occurs automatically and serves as a backup to a conventional overcurrent protection system for de-energizing high impedance electrical distribution primary faults, while permitting normal service to continue on the unaffected remainder of the power distribution circuit.

Plug-in, socket-type electric watthour meters are commonly used in the electric utility industry to measure electric power consumption at commercial, industrial or residential building locations. Meter installations typically include an enclosed panel, or cabinet, attached to an outside wall of the building structure which includes pairs of terminals connected to an electric power source, as well as to electric load conductors. The terminals are adapted to receive blade contacts of a plug-in electric meter to complete an electric circuit between the line and load terminals. Occasionally, it is necessary to disconnect electric power service to the building structure for various reasons. When this occurs, the electric meter is left in the cabinet to facilitate re-connection of the meter when electric service is restored. Various adapters have been developed to allow for mounting the meter in the electric power source cabinet while in an out-of-service status. One such adapter is disclosed in U.S. Pat. No. 4,311,354 which allows for positioning of the meter in various angular orientations for indicating that the meter is in an out-of-service condition. U.S. Pat. No. 5,033,973 discloses another out-of-service meter storage adapter which provides for a voltage potential applied to the meter source side while out-of-service for energizing the meter's semiconductor programmable memory and battery charging circuit. U.S. Pat. No. 8,177,580 discloses a disconnect adapter for an electric meter which enables the terminals of the meter socket to transfer only enough current to power the electric meter for monitoring and verifying that unauthorized electrical power is not being consumed.

There is a need for an out-of-service smart electric meter connection arrangement which allows the smart meter to continue operating in the electric power distribution system as by communicating with other smart meters, as well as communicating with a meter monitoring/control center, i.e., host computer, to facilitate the safe and convenient verification that unauthorized electric power is not being consumed at the site of the out-of-service meter while maintaining downstream communication in the smart meter system.

There is also the need for quickly and safely detecting, isolating and clearing a high impedance fault such as a downed electric utility primary distribution circuit conductor using a low cost, remotely controlled, spring-loaded grounding device.

OBJECTS AND SUMMARY OF THE INVENTION

Accordingly, it is an object of the present invention to quickly and safely detect, isolate and de-energize an AC electric utility primary distribution circuit conductor which has developed a high impedance, low current fault, such as caused by a downed wire or an isolated equipment failure, e.g., a distribution transformer fuse, which low impedance/high current detection systems have been unable to detect, or clear, in a safe and timely manner.

It is another object of the present invention to minimize electric utility live wire down time for increased public safety and reduced potential utility liability, without interrupting service to unaffected utility distribution system customers.

A further object of the present invention is to provide a system for quickly and automatically detecting and locating a downed electric power line which is limited in speed only by built-in time delays in the system circuitry, allows for operation of conventional overcurrent detection and shutdown circuitry, and is without limits in terms of the physical distance to, and the fault level current of, the downed line conductor.

Yet another object of the present invention is to provide for the detection, localization, isolation and de-energizing of a high impedance fault in an electric utility power line in a manner which is particularly adapted as a back-up to high impedance fault detection and overcurrent protection systems, and which provides an indication of the clearing of the high impedance fault and return to safe power distribution system operation.

A still further object of the present invention is to provide for the tripping of an electric utility operator's high impedance fault protection device in the event of a high impedance fault characterized by a very low fault current, where the protection device is a recloser, sectionalizing device or a fuse.

Another object of the present invention is to provide a detection, isolation and de-energization arrangement for a high impedance fault in an electric utility line which is particularly adapted for operation in an electric power system incorporating plural smart electric meters which not only provides system voltage status information at the location of the smart meters closest to the high impedance fault, but also the status of smart meters located more remote from a central monitoring/control station to which this system status information is provided.

These features are provided in a low fault current isolation arrangement which senses a loss of voltage and automatically isolates and de-energizes a down live primary wire if overcurrent protection devices have not cleared the high impedance fault in an electric power distribution network. Incorporating an operator selectable time delay response, the low fault current isolation arrangement permits overcurrent protection devices to attempt to detect and shut down the affected conductor, and to then isolate and shut down the low current fault if the overcurrent devices are not successful. The low fault current isolation arrangement continuously monitors AC voltage as remotely provided by smart meters even after a fault location is de-energized, and serves as a back up, but not as a replacement, for existing overcurrent protection schemes. A host computer operates in conjunction with plural smart meters each coupled to an associated customer distribution transformer in conjunction with a fault isolator to detect and shut down high voltage faults characterized by a low fault current in the faulted conductor.

In accordance with another feature of the present invention, it is another object of the present invention to allow an electric utility watthour meter to continue to perform communications functions in an electric utility network when in an out-of-service status.

It another object of the present invention to allow an out-of-service electric meter in an electric power distribution system to relay system status information from more remote electric meters to a central monitoring/control facility.

A further object of the present invention is to facilitate the safe monitoring and verification by an out-of-service electric meter at a customer location that the customer is not consuming electric power without exposing an electric utility worker performing the verification to a hazardous situation which could cause injury and/or property damage.

Yet another object of the present invention is to maintain electric power to an out-of-service electric meter located at a residential or commercial building to allow the meter to perform electric utility network communications functions other than measuring the amount of electric power delivered to a customer.

Still another object of the present invention is to provide a safe, easy means for detecting de-energized customer back-feeding of an electric watthour that has had normal electrical service disconnected such as for non-payment.

Another object of the present invention is to use smart electric meters in lieu of voltage monitors as a source of power loss notification and for providing more thorough and complete evaluation and analysis of the entire electrical power network as power outage data is forwarded to a trouble dispatcher and router and then to a system host computer for evaluation of a possible downed wire which remains energized in a specific distribution feeder circuit.

These features are provided by an electric meter adapter for connecting an electric meter to a meter socket in an electric power distribution network. The adapter includes a non-conductive, generally circular housing having a planar inner base panel with two pairs of linear, spaced first apertures therein, with each pair of apertures adapted to accommodate a respective secondary voltage, AC power distribution circuit. Disposed on a first outer surface of the base panel are four insulating jaws and four conductive flanges, all of which are adapted to receive a respective meter conductive blade. Disposed on the base panel's second inner surface are four conductive tabs each coupled to a respective socket of a customers electric power distribution network. Also disposed on the base panel inner surface are a pair of conducting elements, or buses, each having a respective tab and a respective second aperture, where each tab is inserted through a respective first aperture and is in contact with a respective conductive flange and each second aperture is aligned with a respective first aperture. With the adapter and meter in a first position, the meter is in circuit with the power distribution circuit for measuring a customer's power consumption. Rotation of the meter and adapter combination to a second position, removes the meter from the customers power distribution network, while continuing to energize the meter to allow the meter to carry out various monitoring and control functions in the electric power distribution network.

Accordingly, it is an object of the present invention to detect a fault in a high voltage system and quickly and safely direct the high voltage fault to a grounded neutral.

It is another object of the present invention to provide in parallel with a first high voltage distribution circuit, a second circuit coupled to and arranged in parallel with the first circuit for instantaneously detecting and directing a high impedance fault in the first high voltage circuit to a neutral ground path.

A further object of the present invention is to provide a fused isolation device capable of direct or remote control for use in a three-phase high voltage electric distribution network for quickly and safely detecting and directing high impedance network faults to neutral ground, where the fused isolation device is directly coupled and responsive to the high impedance fault.

Yet another object of the present invention is to quickly clear a high impedance fault in an electric power distribution network within three cycles of operation of the sensing of the fault using a high speed, high reliability fuse tripping mechanism actuated either directly or remotely for routing the fault directly to neutral ground potential.

A still further object of the present invention is to clear a high impedance fault such as caused by a downed or damaged distribution line in an electric power distribution network using a high speed fuse coupled to the load, or secondary, winding of a power distribution transformer in directing the fault to neutral ground potential.

These features are provided in a high-speed, low cost automatic tripping device for clearing a high impedance fault such as, for example, a downed high voltage conductor within a utility power distribution grid which includes a solenoid receiver in combination with a coiled spring. Responsive to a received direct or remote (RF) signal representing the fault condition, the solenoid releases the coiled spring which is under tension from a latched configuration, with the coiled spring then contacting a grounded brass rod in contact with a fuse cutout through which the high voltage conductor is directed. The fuse cutout partially under the influence of gravity and spring tension then moves to a released position, opening the high voltage circuit, which is in parallel with the inventive high impedance clearing circuit, for safely and quickly directing the high impedance fault to a grounded neutral path.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIGS. 12 and 13 are perspective views of the inventive automatic tripping device for clearing a high impedance fault in an electric power distribution network; and FIG. 14 is a circuit schematic diagram illustrating the flow of backfeed electric current within an electric power distribution network incorporating coupled multi-phase power distribution transformers, where the backfeed electric current is due to a high impedance fault in the primary, or source, side of the network.

DETAILED DESCRIPTION OF THE PREFERRED EMBODIMENTS

Figure 1:
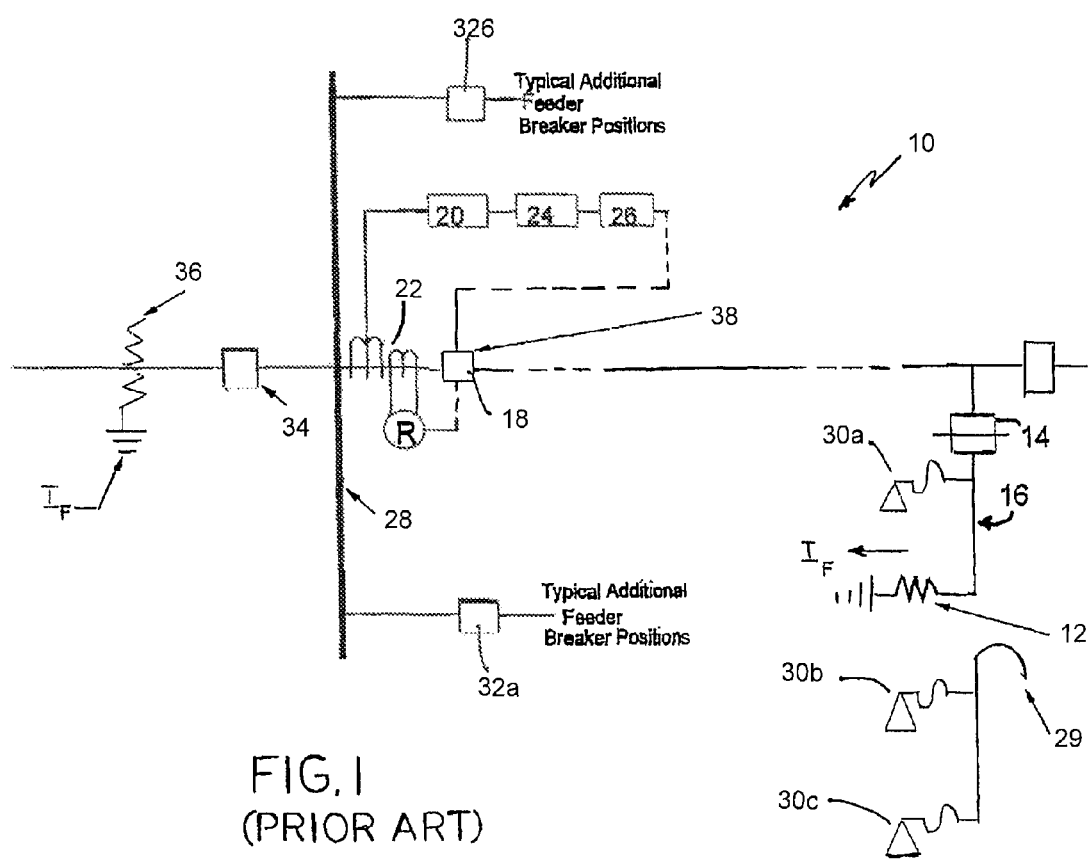
FIG. 1 is a simplified combined block and schematic diagram of a prior art high impedance fault sensing arrangement such as for use in an elective power distribution network.
Figure 2:
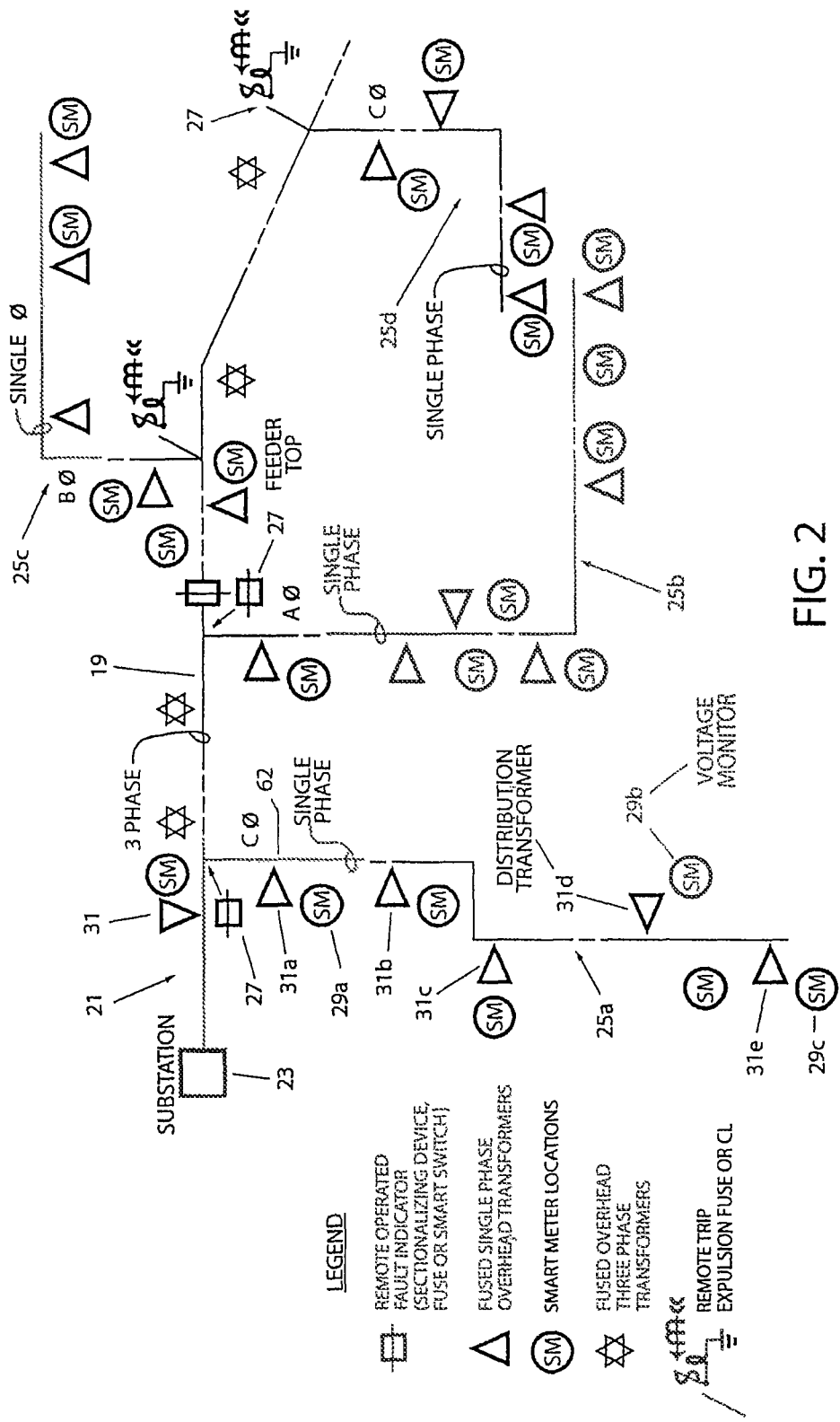
FIG. 2 is a simplified schematic diagram of a portion of an electrical distribution system incorporating an arrangement for isolating high impedance faults in the system in accordance with the present invention.

Referring to FIG. 2, there is shown a simplified schematic diagram of a portion of an electrical distribution system 21 incorporating an arrangement for isolating high impedance faults with low current in accordance with the present invention. The electrical power distribution system 21 includes a substation 23 and a three-phase main feeder line 19. Coupled to the main feeder line 19 are plural branches 25*a*, 25*b*, 25*c* and 25*d*, each of which receives a single phase in the three phase power distribution system 21. Each of the branches is essentially the same, with additional details of only the first branch 25*a* provided herein for simplicity, with the same identifying numbers used in each of the branches to identify the same components in these branches. The first branch 25*a* includes a plural distribution transformers 31*a*, 31*b*, 31*c*, 31*d* and 31*e*, each of which is shown as a triangle in the figure. The first branch 25*a* further includes a plurality of smart meters, three of which are shown as elements 29*a*, 29*b* and 29*c*, and each of which is shown in the figure in the form of "SM" enclosed in a circle. Each smart meter is coupled to an independent communications system such as a telephone, radio frequency (RF), or carrier frequency network and is further connected to the secondary side of a respective distribution transformer. The first branch 25*a* further includes a remote operated fault isolator 27 located at the juncture of the branch and the main line 19 of the electrical distribution system 21, and may include additional fault isolators distributed in a spaced manner in the branch top 62 as well as in main feeder line 19.

Figure 3:
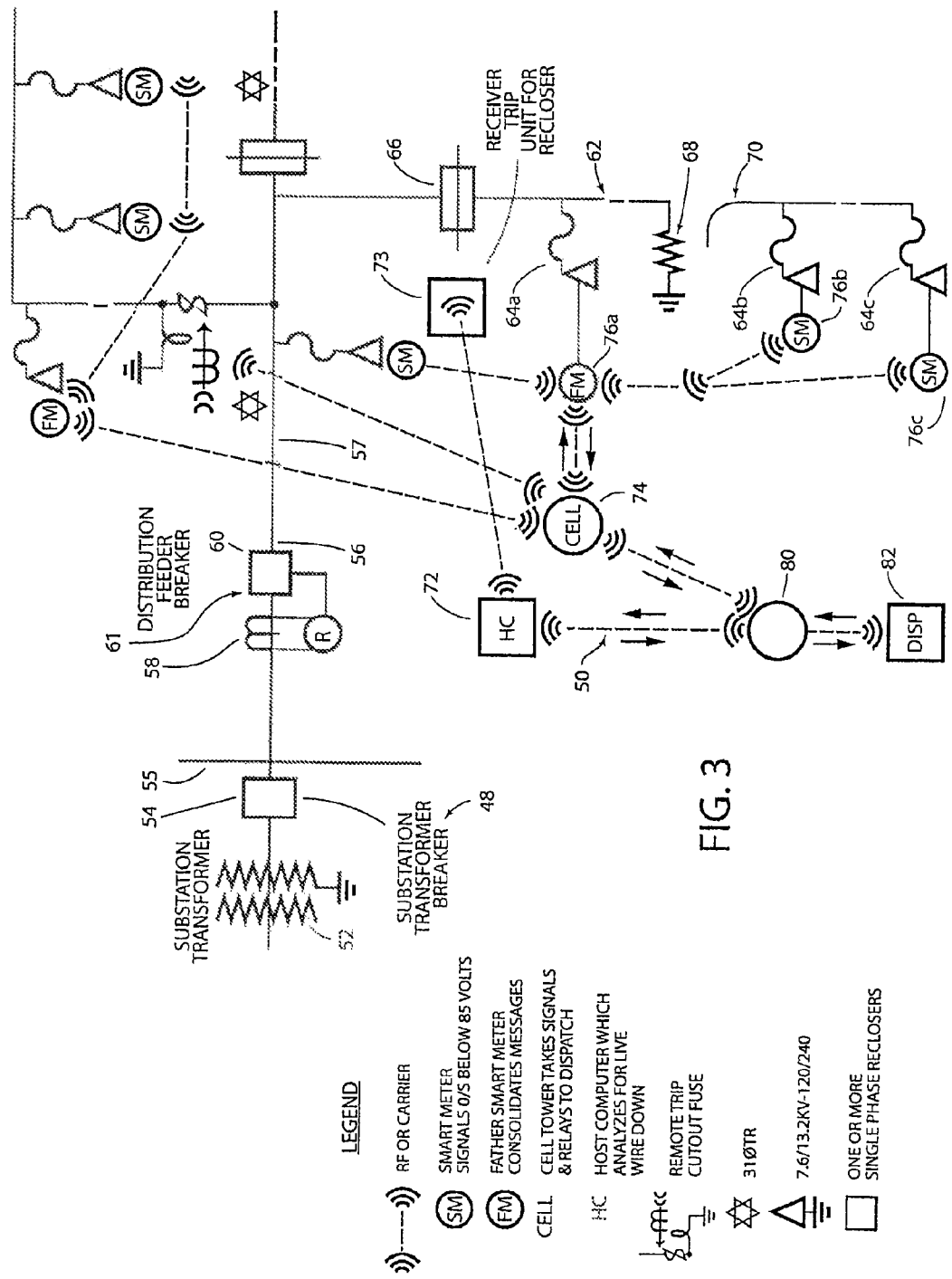
FIG. 3 is a simplified schematic diagram illustrating additional details of a low fault current isolator system in accordance with the principles of the present invention.

Referring to FIG. 3, there is shown a simplified schematic diagram of a portion of an overhead distribution primary circuit 56 in an electrical distribution system 48 incorporating a high impedance fault detection and isolation arrangement 50 in accordance with the present invention. This overhead distribution primary circuit 56 has experienced a high impedance fault 68 on a branch tap 62 not detected by a fuse, a circuit recloser or by a main overcurrent-relay circuit breaker combination 61. Smart meters 76*a*-76*d* and a fault isolator 66 are programmed to check the AC system voltage magnitude each second. A root mean square (RMS) voltage less than 85 volts for more than three (3) cycles is considered a loss of voltage. Smart meters 76*a*-76*d* store a change in voltage status and if the status change continues beyond a preselected time delay, e.g., beyond five (5) seconds, and an indication of the loss of voltage is transmitted by an internal modem (Flexnet Smartpoint) to a father smart meter 76*a* over a communication link (either in the form of a telephone hard wired system, a radio frequency (RF) link, or a carrier frequency network to a host computer (HC) 72 via the combination of a cell tower 74 and server/sorter 80. The host computer 72 after analyzing the condition status of each of the smart meters 76*a*-76*d* and a fault isolator 66 on the branch tap 62, makes a decision in accordance with a program stored in the host computer. If the data received indicates a wire down condition, the host computer 72 sends a coded trip signal to the fault isolator 66 which trips the fault isolator, isolating the high impedance fault. The host computer 72 also forwards written location information to a work dispatcher (DISP) 82 in the high impedance fault detection and isolation arrangement 50 in the present invention to initiate and coordinate repair and service restoration efforts.

With regard to voltage monitoring, each of the smart meters 76*a*-76*d* has a metrology chip which processes the voltage signal from its associated sensor board. The voltage is measured using a precision resistive voltage divider. Power is considered lost when the voltage is 20% less than the rated voltage 120 volts, or 85 volts or below, for three (3) or more seconds. The voltage is retrieved every 90 cycles by the metrology processor. A smart meter equipped with Flexnet Smartpoint is capable of providing an indication of loss of voltage and actual time duration of the loss of power after a preset time delay of five (5) seconds. The smart meter will also report the restoration of voltage and the actual time of restoration, with a time delay of five (5) seconds. These voltage status signals can be provided on either of two (2) channels. Each smart meter is provided with a regulated voltage via a capacitor connected to a voltage divider and is manufactured in accordance with ANSI C12.20-2002. The smart meter processor gathers voltage data once every second and can verify a loss of voltage on an inquiry so long as the aforementioned capacitor remains charged. Once the capacitor is recharged, the system resets and subsequent voltage interruptions can be reported. The smart meter Flexnet Smartpoint module can count momentary voltage outages of less than three (3) seconds, such as caused by tree contact or a downed arcing wire. The base station can query each smart meter for recovering the smart meter's time-stamped momentary voltage outage history.

The low fault current isolator system 50 continuously monitors AC voltage in the overhead distribution primary circuit 56 using the smart meters 76*a*, 76*b*, 76*c* and 78 for identifying and locating possible wire down situations. Each of the smart meters 76*a*, 76*b*, 76*c* and 78 report any change in AC voltage status in branch tap 62, or on the main feeder line 57, on the secondary side of any of distribution transformers 64*a*-64*d*. A detected out-of-range AC voltage level of less than 85 volts RMS relative to the normal voltage (120 volts) of the electrical distribution system 48 gives rise to an alarm voltage signal. In the event a transformer secondary voltage value less than 85 volts RMS is detected, the low fault current isolator system 50 incorporates an operator-selected predetermined time delay following detection of an under voltage situation, with an appropriate voltage change signal output forwarded by the father smart meter 76*a*. This predetermined time delay is incorporated within the low fault current isolator system 50 to allow conventional overcurrent protection circuitry to first attempt to detect, isolate and de-energize the overcurrent location. Host computer 72 is provided with a software program to analyze an under voltage condition in terms of detecting, isolating and de-energizing the high impedance location. Host computer 72 is programmed to analyze the outputs from all of the smart meters from which status inputs are received, and to interrogate other smart meters within the same overhead distribution primary circuit 56 system to ascertain and locate any other loss of voltage condition. Upon receipt by host computer 72 of an output from a group of smart meters indicating a high impedance fault, host computer provides an appropriate signal to fault isolator 66 in branch tap 62 of the particular smart meter from which the loss of voltage signal was received to shut down the distribution feeder segment having a live wire down. Host computer 72 notifies work dispatcher 82 of any action taken and identifies the tap location experiencing a wire down situation to facilitate repair of the faulty condition and the restoration of power at that location. The low fault current isolator system 50 continuously monitors each of the smart meters on the main feeder line 57 as well as those in branch tap 62 even after a given location is de-energized following detection, isolation and de-energization of the under voltage source involved to detect any subsequent voltage restoration or service restoration.

The low fault current isolator system 50 is designed and intended to complement any existing overcurrent protection scheme as shown in FIG. 3. Host computer 72 may be in the form of a standard personal computer (PC) and is adapted to analyze the output from each of the smart meters 76*a*, 76*b*, 76*c*, and 78 and to automatically generate and transmit a command to the appropriate fault isolator 66 to de-energize a downed conductor. Host computer 72 is programmed with Visual Basic Software to provide this analytical capability. Each of the smart meters 76a, 76b, 76c and 78 is connected to the low voltage side of a respective one of the distribution transformers 64a-64d for sensing secondary voltage at the transformer. The control circuit shown in FIG. 3 disposed between host computer 72 and the overcurrent protection devices within the main overcurrent-relay circuit breaker combination 61 to allow the host computer to send a trip signal to the appropriate fault isolator 66 to de-energize a live wire down. Fault isolator 66 serves as a fault current interrupting device and is responsive to the output of the host computer 72 for assuming either a closed or open status for either providing voltage or interrupting the application of voltage of the associated branch distribution transformers involved. The Visual Basic Software used in host computer 72 allows the host computer to perform a complete analysis of any loss of voltage problem within the overhead distribution primary circuit 56, or other distribution circuits covered by host computer 72, and select an option to isolate and de-energize the under voltage portion of the overhead distribution primary circuit 56 and report to the work dispatcher 82 the details of the distribution circuit involved. The operation of the low fault current isolator system 50 allows a fault isolator 66 to shut down the location of a low current, high impedance fault in the event an overcurrent protection device in the main overcurrent-relay circuit breaker combination 61 does not function to terminate the fault condition because of either the low value of the fault current or the timed duration of the distribution feeder breaker 60 was insufficient to trigger an overcurrent protection procedure.

In the typical electrical distribution system 48, the load current in normal operation is typically on the order of 300 amps, while a fault current will typically be small fraction of this current when there is very high impedance at the fault location. Overcurrent protection circuitry within the main overcurrent-relay circuit breaker combination 61 addresses the high fault current situation by comparing the present current on the main feeder line 57 or branch tap 62 with a pre-determined current value and opening the circuit if the pre-determined current value is exceeded. With reduced impedance at the location of the fault, the current may be as great as 10,000 amps. The main overcurrent-relay circuit breaker combination 61 includes a timer circuit which measures how long the overcurrent situation continues, or over how many cycles the overcurrent situation extends, for automatically shutting down the circuit if overcurrent the situation exceeds a pre-determined time period.

Each of the smart meters 76b, 76c and 76d, as well as the father smart meter 76a, is coupled to an independent communications system such as a telephone network, a carrier frequency network, or, as shown in FIG. 3, a radio frequency (RF) communication system for wireless communications between the smart meters 76b, 76c and 76d and the father smart meter 76, and between the father smart meter and the host computer 72 of the low fault current isolator system 50. The present invention also contemplates the use of higher carrier frequencies available on the high voltage distribution lines to provide two-way communications between various system components as shown in FIG. 3 and as described herein. Also included in the low fault current isolator system 50 is a cell tower 74 and a server/sorter 80, which is coupled to the host computer 72 as well as to the work dispatcher 92. Stored in the host computer 72 are maps of the entire electrical distribution system 48 including the individual location and address of each distribution transformer and smart meter combination. Cell tower 74 is in wireless (RF) communication with the father smart meter 78 and server/sorter 80. Host computer 72 is also in RF communication with an antenna 73 coupled to fault isolator 66 disposed within branch tap 62. Finally, a main overcurrent-relay circuit breaker combination 60 is coupled to the main feeder line 57 by means of a transducer 58 to provide overcurrent detection within the overhead distribution primary circuit 56. Host computer 72 is capable of generating a customer shutdown signal which is provided to the fault isolator 66 on the customer's branch tap 62 for terminating the service of a particular customer such as for an unsafe situation, e.g., a live wire down, at or near a customer's location.

The inventive low fault current isolator system 50 addresses the situation where the overhead distribution primary circuit 56 experiences a high impedance fault 68 on a branch tap 62 or main feeder line 57 which is not detectable by the main overcurrent-relay circuit breaker combination 61. Smart meters 76b and 76c, the father smart meter 76a and fault isolator 66 are programmed to check the AC system voltage magnitude each second on branch tap 62. A root mean square (RMS) voltage of 85 volts or less is considered a low, unsafe voltage for refrigerator and air conditioner operation. Smart meters 76b, 76c and 76d and the father smart meter 76a record and store a change in voltage status, and if the voltage status change continues beyond a preselected time duration, a change in voltage status signal is transmitted by the father smart meter 76a to cell tower 74, where the communications link is an RF link or other conventional communications link. This information is then transmitted from cell tower 74 via server/sorter 80 to the host computer (HC) 72. The host computer 72, after analyzing the condition status of each of the smart meters 76a-76d and the status condition of the fault isolator 66, makes a decision in accordance with the program stored in the host computer. If the data received indicates a wire down condition, host computer 72 sends a coded trip signal to fault isolator 66 for tripping the fault isolator and isolating the high impedance fault. Host computer 72 also forwards written location information regarding the detected high impedance fault 68 via server/sorter 80 to a work dispatcher (DISP) 82 within the low fault current isolator system 50 of the present invention to alert and activate maintenance crews.

Upon determination of the existence of an isolated secondary voltage outage on the load side of a distribution transformer, location and verification of this outage is provided by that distribution transformer's smart meters, and host computer 72 provides a lockout signal to that distribution transformer's fault locator 66 removing the transformer. In this process, the voltage on both the low voltage side and on the high voltage side of each affected distribution transformer is monitored by its associated smart meter which transmits this information to the host computer 72.

Following detection of a high impedance fault and isolation and shutdown of those portions of the overhead distribution primary circuit 56 experiencing the high impedance fault, host computer 72 receives a series of output status signals at short intervals from the distribution transformers involved via their respective smart meters to determine if the fault has been isolated and neutralized, and if service at those distribution transformers has been restored. This communication between host computer 72 and the various smart meters continues until the voltage status changes. Thus, the low fault current isolator system 50 analyzes loss of voltage on the overhead distribution primary circuit 56 and automatically de-energizes and isolates a down live primary wire if the overcurrent protection system has not cleared the down conductor which formed a high impedance fault.

The low fault current isolator system 50 also provides backup clearing for the overcurrent protection system in the main overcurrent-relay circuit breaker combination 61, but does not replace it. The inventive low fault current isolator system 50 has a user adjustable time delay response which permits any combination of overcurrent protection devices to sense, isolate and de-energize a detected fault current before the low fault current isolator 50 of the present invention initiates it's analysis, operation and notification. The low fault current isolator system 50 is programmed to differentiate between the following causes of loss of voltage, resulting in either a complete or partial overhead distribution primary circuit 56 shut down.

(1) An outage (momentary or lock out) by the main overcurrent-relay circuit breaker combination 61 with all primary tap protection devices i.e., fault isolators 66, in each of the branch taps 62 still in a non-operating mode. The host computer 72 analyzes the status of all of the various feeder tap protection devices, i.e., determines whether all feeder tap protection devices are closed or open from the smart meter input data, and concludes that the feeder overcurrent protection system has functioned as designed and notifies the work dispatcher 82 via server/sorter 80. The low fault current isolator system 50 then resets and monitors the status of the primary tap protection devices in the overhead distribution primary circuit 56 for any change in voltage status.

(2) A branch tap protection device has opened for a fault. Host computer 72 reviews the data received from the smart meters 76a, 76b, 76c and 76d and concludes that the overcurrent protection device in the main overcurrent-relay circuit breaker combination 61 has functioned as designed. Host computer 72 then notifies work dispatcher 82 of the location of the overcurrent protection device that has functioned as designed, and resets to monitor the status of the circuit 56. In this case, there is no tripping action of the low fault current isolator system 50.

(3) In an isolated incident, a fault such as a blown distribution transformer high side fuse or an open winding of a distribution transformer is detected. After receiving notice of the single equipment fault and interruption in service from one of the smart meters, host computer 72 checks the remaining smart meters on the same branch tap 62 and concludes that it is an isolated incident. Host computer 72 then notifies work dispatcher 82 of the location of the faulty transformer, which does not necessitate tripping action of the low fault current isolator system 50, and no further action is required.

(4) A primary live wire is determined to be down, resulting in a loss of service for some customers of the electrical power distribution system 48. The host computer 72 logs in a loss of voltage at one or more locations on the affected branch tap 62 and determines that there is a live voltage condition at one or more of the smart meter locations on the same branch tap. This information is interpreted as a live wire down and the host computer 72 issues a tripping (lockout) order to the appropriate branch protection device, i.e., fault isolator 66, and forwards the location information of the affected overcurrent devices to the work dispatcher 82 for directing a work party to the affected location(s). The fault condition must be repaired before the fault isolator is reset by the repair crew. Restoration of voltage to the smart meters will reset the system 50 for the affected location.

(5) A primary live wire is determined to be down, but not broken or severed, resulting in intermittent arcing to earth, or to another conducting medium. Host computer 72 senses and counts the number of voltage reductions under 85 volts RMS. The reduced voltage values are associated with arcing fault current and the resulting voltage across the high impedance fault 68 when a fault current is flowing to ground. Host computer 72 compares the number of arcing events which occur over a selected time interval to a predetermined number of events programmed in the host computer, and the host computer triggers, or trips, the fault isolator 66 located in the branch tap 62 of the arcing wire for de-energizing this wire. Host computer 72 then forwards this data to the work dispatcher 82. Repair of the problem and restoration of the voltage to the smart meters will reset the sensing system 50. The low fault isolator system 50 resets, looking for another change in balance of the system voltage status.

Figure 4A:
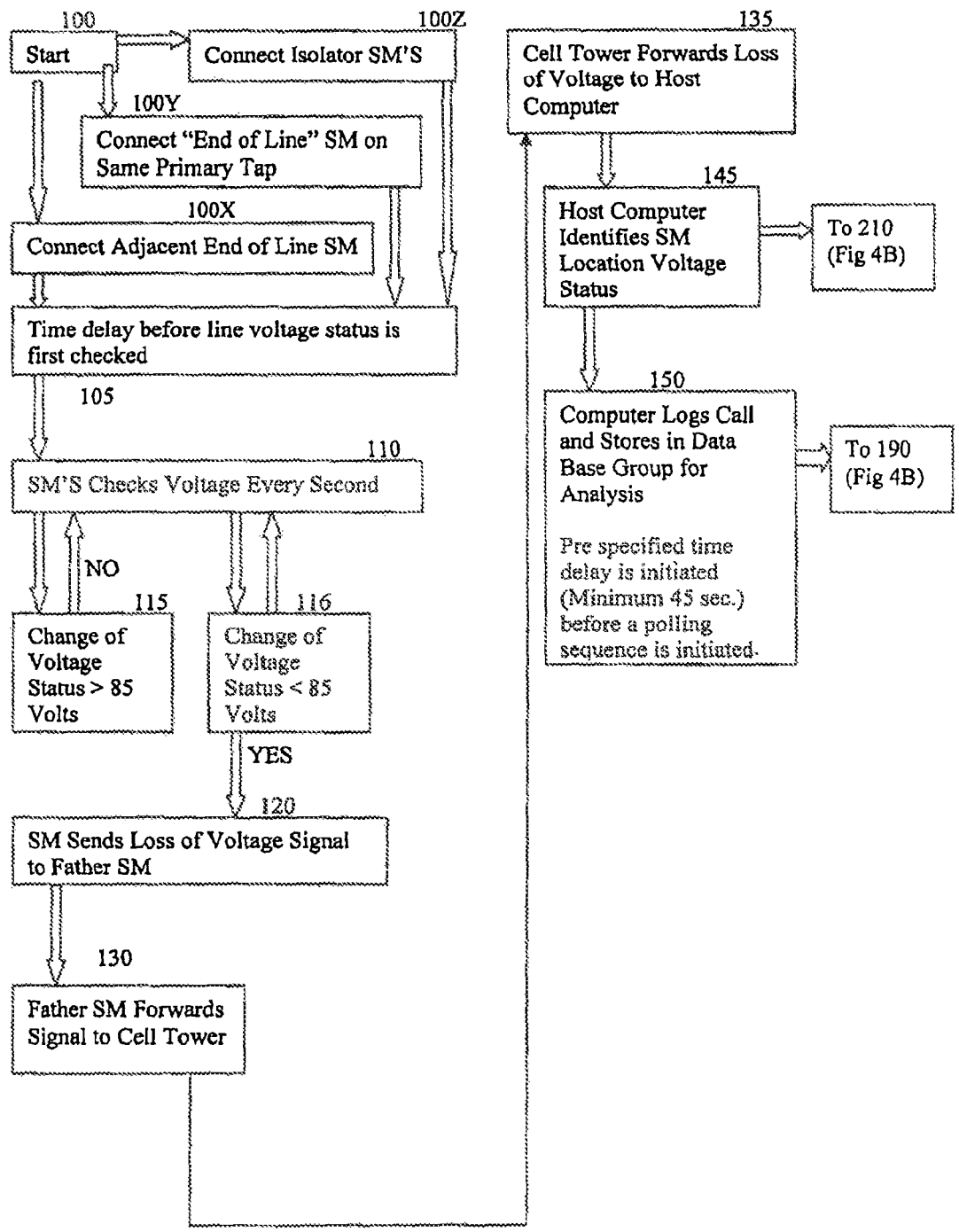
FIGS. 4a and 4b are flow diagrams illustrating the various operations carried out during operation of the low fault current isolator system of the present invention.
Figure 4B:
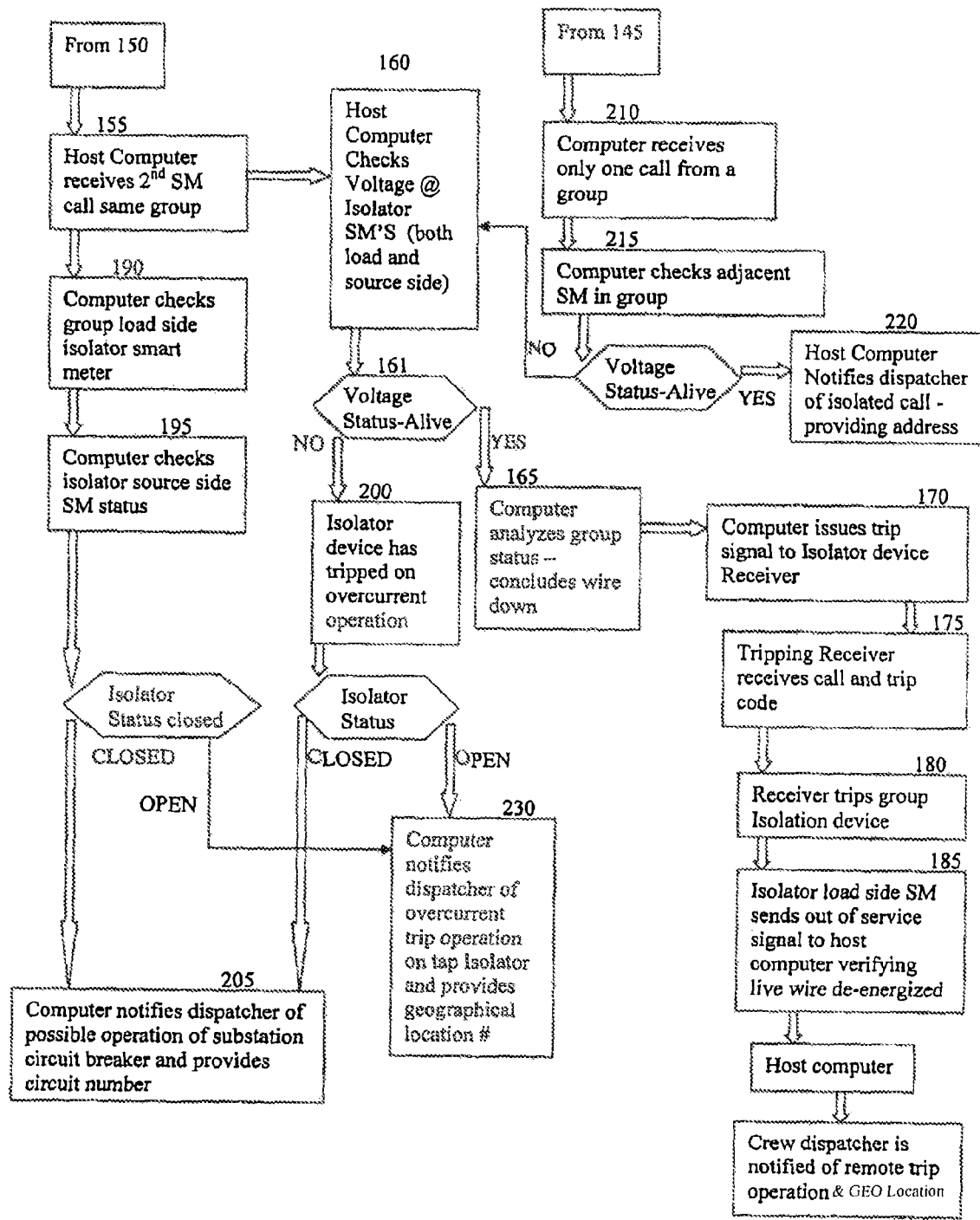

Referring to FIGS. 4a and 4b, there are shown flow charts illustrating the sequence of operations carried out by the low fault current isolator system 50 of the present invention. Upon initial installation of smart meters 76a-76d in the electrical power distribution system 48 at step 100 as shown in FIG. 4a, and with the connection of the smart meters to the line voltage at steps 100X and 100Y, and the fault isolator 66 smart meters connected at step 100Z, there is a fifteen second time delay at step 105 before system voltage status is initially checked by each smart meter at step 110. The smart meters and fault isolator, which are controlled by microprocessor devices, are programmed to check the AC voltage level every second at step 110. The smart meters are each connected to the 120/240 volt secondary side of a respective distribution transformer. The program then at step 115 determines if a change in voltage status has occurred. If the voltage is 85 volts or less, or 20% less than the standard AC voltage (120 volt) of the electric power distribution system as determined at step 116, the program then proceeds to step 120 if the voltage is less than the system's average voltage of 85 volts. The smart meter sends a loss of voltage signal to father smart meter 76a. The father smart meter 76a forwards the signal to cell tower 74. Cell tower 74 forwards the loss of voltage signal to host computer 72.

The host computer 72 using Visual Basic software identifies the smart meter address and voltage code at step 145. The specific reporting smart meter (I.D. number and voltage condition) is recorded by the host computer 72 with the date and time of the call and this information is stored in a specific file for final analysis at step 150. After receiving the first call from a smart meter, the host computer 72 is programmed with the aforementioned timed delay of 45 second to await additional calls from its specific monitor group. If an adjacent smart meter in the same group rings in as detected at step 155 shown in FIG. 4b indicating loss of voltage, the host computer 72 is programmed to perform a status check of the fault isolator 66 and then the program proceeds to step 160 also as shown in FIG. 4b.

If the fault isolator 66 indicates that it is energized at step 161, the host computer 72 analyzes the data of a specific group at step 165, and then executes the decision on a possible wire down situation by sending a coded trip signal at step 170 via the communications system being used to the fault isolator 66 at step 175 to remotely trip the involved primary tap group protection device (fault isolator) at step 180 to isolate the downed live primary conductor. The outage information regarding the protective device location and operating status is also forwarded at step 170 by the host computer 72 via the server/sorter 80 to the crew dispatcher 82 at step 185.

If the host computer 72 receives a call from a branch tap 62 fault isolator 66 smart meters, any of the following conditions or steps may be possible.

(1) Main feeder breaker open;
(1A) A fault isolator 66 status check is conducted at step 195 by the host computer 72. If the associated smart meters indicate that the fault isolator 66 is open, the host computer 72 notifies the dispatcher 82 of overcurrent operation in a group of smart meters at step 230 and provides appropriate geographic addresses. If the fault isolator 66 is closed, host computer 72 checks other associated smart meters in the same circuit and if they indicate a loss of voltage, the host computer notifies the dispatcher 82 of possible main circuit breaker operation and provides the appropriate circuit number to the dispatcher 82 at step 205;
(2) Feeder tap fault isolator;
(2A) If the host computer 72 logs in a first smart meter call at step 150 in FIG. 4a, and receives a second smart meter call from the same group at step 155 in FIG. 4b, the host computer checks the fault isolator 66 load side smart meters at step 160. If the host computer 72 finds no voltage, and the isolating devices show an open tap fault isolator via a status check at step 200, the host computer then notifies the dispatcher 82 of overcurrent operation and the geographical location of the fault.
(3) Isolated incident; if the host computer 72 receives only a loss of voltage call from a smart meter 66 at step 210, the host computer checks the associated group of smart meters. If the associated group of smart meters is in-service, the host computer 72 issues a notification of an isolated incident at step 220; or
(4) Restoration of Voltage. The restoration of voltage after a previously reported outage involves a smart meter or fault isolator 66 status check at step 210 in FIG. 4a every second. If there is a change in status and the voltage is restored, the host computer proceeds through the call sequence of steps 105, 110 and 115 and notifies the dispatcher 82 of voltage restoration at the affected addresses.

Figure 5:
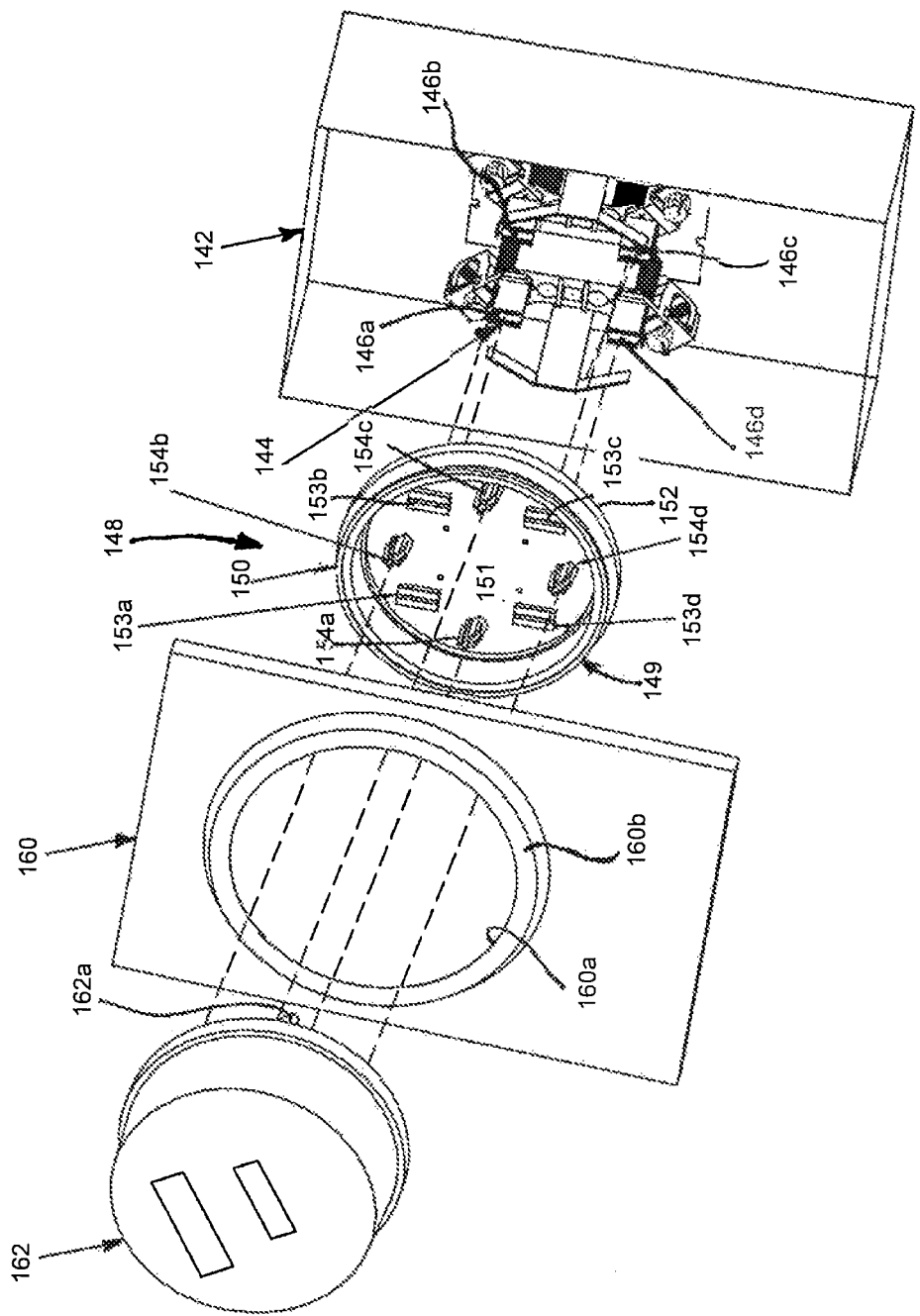
FIG. 5 is an exploded perspective view of an electric watthour meter installation incorporating an adapter for engaging and positioning an electric watthour meter either in an in-service configuration or in an out-of-service configuration in accordance with another aspect of the present invention.
Figure 6:
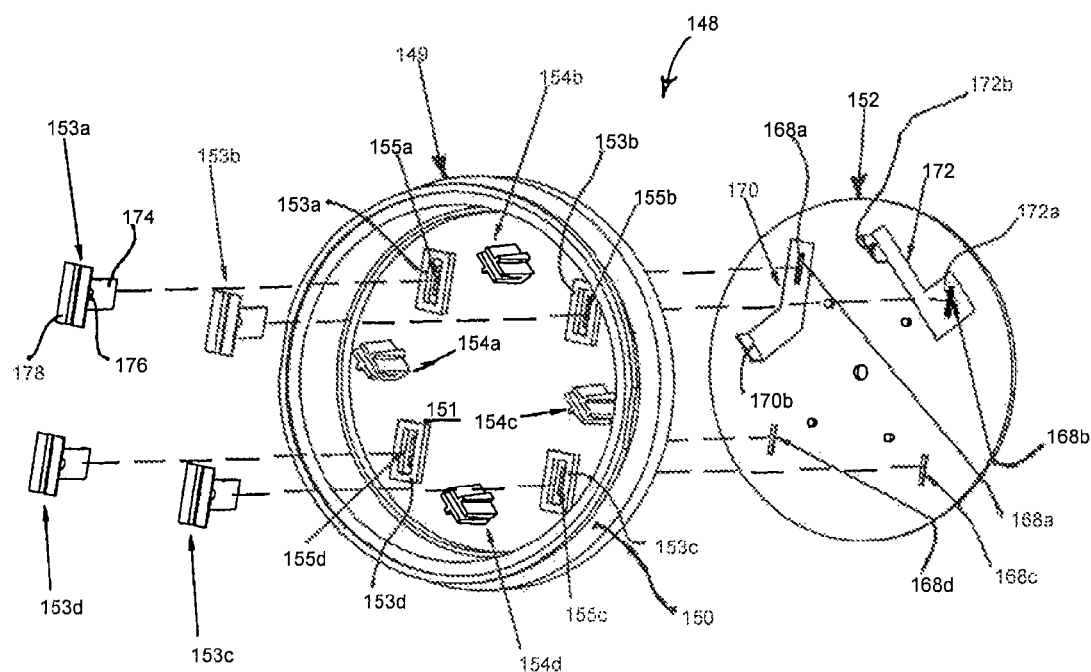
FIG. 6 is an exploded perspective view of the inventive electric meter adapter shown in FIG. 5.
Figures 7, 8:
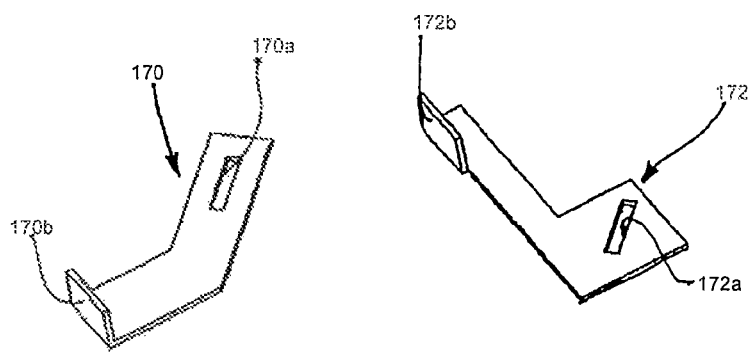
FIGS. 7 and 8 are respectively perspective views of first and second line buses, or conductors, utilized in the inventive electric meter adapter shown in FIGS. 5 and 6.
Figure 9:
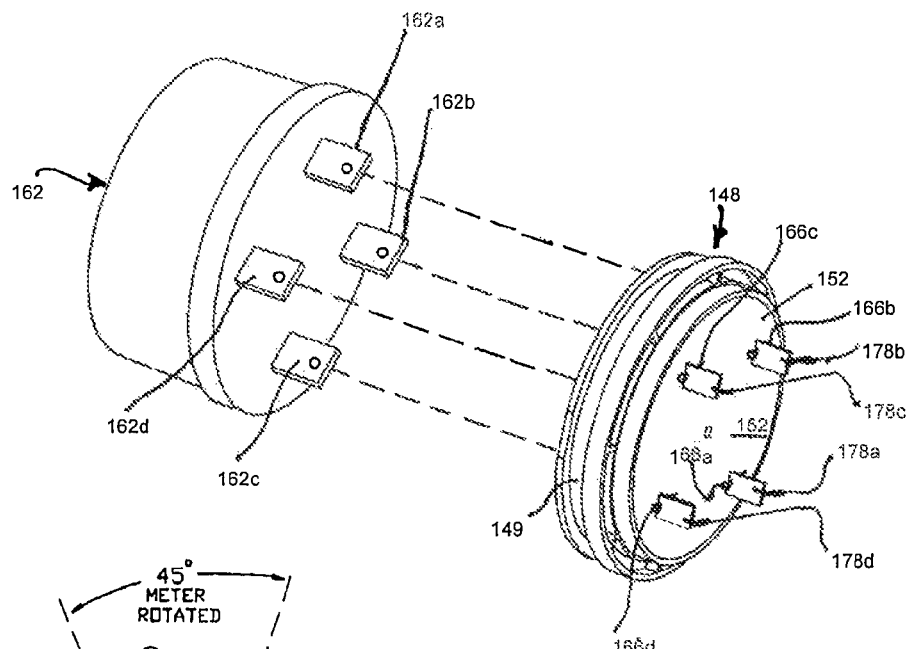
FIG. 9 is an exploded perspective view showing additional details of the combination of an electric meter and the electric meter adapter of the present invention.
Figure 10:
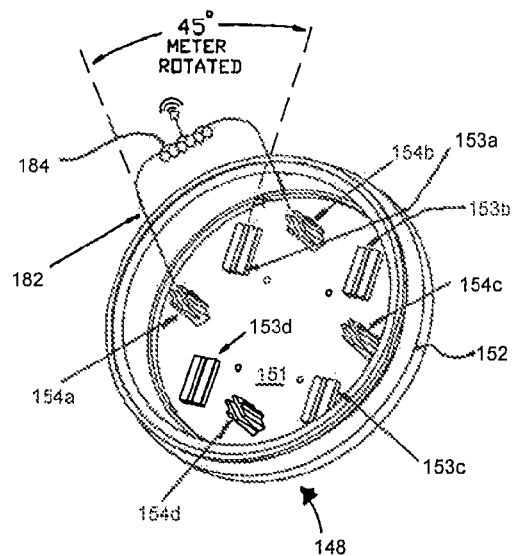
FIG. 10 is a perspective view of the outer portion of the inventive electric meter adapter illustrating an antenna for permitting communication of the meter with other meters and components/systems in the electric power distribution network.

Referring to FIG. 5, there is shown an exploded perspective view of an electric meter adapter 148 for mounting an electric meter 162 in either an in-service configuration or in an out-of-service configuration in accordance with another embodiment of the present invention. FIG. 6 is an exploded perspective view of the inventive meter adapter 148, while FIGS. 7 and 8 are respective perspective views of first and second line buses, or conductors, 170 and 172 utilized in the inventive electric meter adapter. FIG. 9 is an exploded perspective view of the combination of a smart electric meter 162 and the inventive meter adapter 148, while FIG. 10 is a perspective view of the outer portion of the inventive meter adapter 148 illustrating a radio frequency (RF) antenna 182 within the meter adapter for allowing the smart meter to communicate with other smart meters, as well as other components/systems within the electric power distribution system such as a central monitoring/control station in the electric power distribution system. Details of the meter adapter 148 and its installation within a meter socket cabinet 142 will now be described in terms of the aforementioned FIGS. 5-10.

Electric meter 162 is installed in a generally rectangular meter socket cabinet, or box, 142, wherein it is electrically connected to a meter socket 144. Meter socket 144 includes first through fourth electric terminals, or meter socket jaws, 146a-146d, each adapted to engage a respective one of conductive tabs 162a-162d of electric meter 162. The first through fourth terminals 146a-146d of meter socket 144 are coupled to a source of a AC power (not shown for simplicity) so as to provide an AC voltage typically in the range of 120±5% VAC. Meter socket cabinet 142 is typically comprised of a high strength metal, is securely mounted to a structure such as a residential, commercial or industrial building, and is adapted to receive and be coupled to a removable meter socket cover panel 160. Cover panel 160 includes a generally circular aperture 160a around which is disposed an upraised generally circular flange 160b. Flange 160b is adapted to receive the outer periphery of an outer surface of electric meter 162 in a secure, sealed manner. The electric meter installation includes a meter adapter 148 in the form of a housing 149 electrically connected to the four terminals 146a-146d of meter socket 144, as well as to four electric meter contact blades 162a-162d and is disposed between the electric meter and meter socket. Meter adapter housing 149 is comprised of a high strength insulating material, such as plastic, and includes a circular, generally flat base panel 151 coupled to, or formed integrally with, a generally circular lateral wall 150. Circular lateral wall 150 provides the meter adapter housing 148 with a recessed portion which is adapted to receive an inner end portion of electric meter 162. The surface of base panel 151 of meter adapter housing 149 in facing relation to meter socket 144 is adapted to receive a circular, generally planar plastic back faceplate 152, a perspective view of which is shown in FIG. 6. Back faceplate 152 includes four spaced, parallel, generally linear slots 168a-168d. Back faceplate 152 is securely attached to the outer surface of base panel 151 such as by means of a conventional adhesive material. Base panel 151 includes four spaced, parallel, generally linear slots 155a-155d. Each of the four slots 155a-155d in base panel 151 is disposed in alignment with a respective one of the four slots 168a-168d in the back faceplate 152. The pair of upper aligned slots 155a and 168a as shown in FIG. 6 are each adapted to receive the combination of a first flange 178a and a first conductive tab 153a, while the pair of aligned slots 155b and 168b are adapted to receive the combination of a second flange 178b and a second conductive tab 153b. Similarly, the two lower pairs of aligned slots 155c and 168c and slots 155d and 168d are adapted to respectively receive the combination of a third flange 178c and third conductive tab 153c and the combination of a fourth flange 178d and a fourth conductive tab 153d. Each of the first through fourth conductive flanges 178a-178d is securely electrically coupled to a respective one of the first through fourth conductive tabs 153a-153d by means of a respective one of four cotter pins 166a-166d as shown in FIG. 9.

Disposed on the outer surface of the back faceplate 152 are first and second line buses, or conductors, 170 and 172. Each of the first and second line buses 170, 172 includes a respective linear slot 170a and 172a which are disposed over, and in alignment with first and second slots 168a and 168b, respectively, in back faceplate 152. As shown in FIG. 9, there is disposed on the inner surface of back faceplate 152 the four spaced conductive tabs, or blades, 178a-178d. Each of the four conductive tabs 178a-178d is adapted for tight fitting insertion in a respective one of the four terminals 146a-146d of meter socket 144. Each one of the four conductive tabs 178a-178d is provided with a respective aperture for receiving a respective one of the aforementioned four cotter pins 166a-166d. Each of the four cotter pins 166a-166d is also adapted for insertion through a respective aperture (not shown for simplicity) in one of the conductive flanges 153a-153d for coupling each flange to a respective one of the conductive tabs 178a-178d.

Each of the four conductive flanges 153a-153d extends through a respective one of slots 155a-155d within the meter adapter housing's base panel 151 and through one of aligned slots 168a-168d within back faceplate 152 so as to engage a respective one of the four conductive tabs 178a-178d. Each one of the four conductive top flanges 153a-153d is in contact with and electrically coupled to a respective one of the conductive tabs 178a-178d and is securely coupled to its associated conductive tab by means of a respective one of the aforementioned four cotter pins 166a-166d. It is in this manner that a 120 VAC voltage is provided from the inner surface of the adapter housing's back faceplate 152, which is in facing relation to meter socket 144, through the adapter housing's base panel 151 to the outer surface of the adapter housing's base panel 151.

Each of the four conductive flanges 153a-153d is adapted to receive a respective one of the four electric meter's contact blades 162a-162d in a tight-fitting, removable manner. With each of the four meter contact blades 162a-162d disposed within a respective one of the four conductive flanges 153a-153d, and with each of the four conductive tabs 178a-178d disposed within the respective one of the four terminals 146a-146d of the meter socket 144, electric meter 162 is in circuit with the 120 VAC source coupled to the meter socket for measuring and recording electric power provided to a customer.

With the combination of electric meter 162 and meter adapter 148 connected to meter socket 144, as described above, the pair of elongated, spaced line buses, or conductors, 170 and 172, are disposed between and in contact with the inner surface of the adapter's base panel 151 and the outer surface of faceplate 152. Each of the first and second line buses 170, 172 is preferably comprised of a highly conductive metal and includes a respective elongated slot therein. Thus, first line bus 170 includes elongated slot 170a, while second line bus 172 includes a similar elongated slot 172a. Each of the first and second line buses 170, 172 is securely positioned on the outer surface of the adapter's back faceplate 152 and is maintained in position by means of a conventional adhesive material. With back faceplate 152 positioned on the adjacent inner surface of the adapter housing's base panel 151, and maintained thereon by means of a conventional adhesive, the first and second line buses 170, 172 are disposed between and in contact with the back faceplate and the adapter housing's base panel. The first line bus 170 includes a first tab 170b disposed toward the meter adapter housing 149 and extending upward from the meter adapter housing's base panel 151 at a right angle. Similarly, the second line bus 172 includes a second tab 172b oriented generally transverse to the plane of the meter adapter housing's base panel 151 and extending toward meter adapter housing 149. With the back faceplate 152 in proper position upon and affixed to the meter adapter housing's base panel 151, the first slot 170a in the first line bus 170 is aligned with the first slot 155a within base panel 151. Similarly, the second slot 172a in the second line bus 172 is aligned with the second slot 155b within the meter adapter housing's base panel 151. In this configuration, a voltage is applied to the first line bus 170 via the first conductive tab 178a connected to the meter socket 144 and a voltage is also applied to the second line bus 172 via the second conductive tab 178a also connected to the meter socket. Also, with the electric meter rotated 45° from its in-use position, the first tab 170a of the first line bus 170 is inserted through a slot within the adapter housing's base panel 151 and into electrical contact with first plastic jaws 154a, and the second and third tabs 172b and 172c on the second line bus 172 are inserted through respective second and third slots in the base panel and into electrical contact with the second and third plastic jaws 154b and 154c, respectively.

Each of the four plastic jaws 154a-154d includes a respective linear slot therein and is adapted to receive and securely engage a respective electric meter contact blade when the electric meter is rotated 45° from its in-use position with its four contact blades 162a-162d respectively electrically coupled to a respective one of the first through fourth terminals 146a-146d of the meter socket 144. Thus, by removing each of the electric meter's contact blades 162a-162d from a respective one of slots 155a-155d within the adapter housing's base panel 151, and rotating the electric meter 162 in a counter-clockwise direction as viewed in FIG. 10, each electric meter contact blade is inserted in a tight-fitting manner in a respective one of the four plastic jaws 154a-154d. Thus, with the first through fourth meter contact blades 162a-162d respectively inserted in the first through fourth plastic jaws 154a-154d, electric meter 162 is removed from the electric power distribution network and is maintained in a not-in-service condition in the meter socket cabinet 142. In this configuration, an AC voltage is applied to electric meter's first contact blade 162a via the first line bus' first tab 170b and to the electric meter's second contact blade 162b via the second line bus' second tab 172b for energizing the electric meter 162. This permits the electric meter 162 to perform various functions, which are described below, within the electric power distribution system when in an out-of-service condition.

Removal from service of electric meter 162 by removing its contact blades 162a-162d respectively from slots 155a-155d within the meter adapter housing's base panel 151, rotating the electric meter 45° with respect to the meter socket 144, and inserting two of these contact blades into a respective pair of the plastic jaws places the electric meter in an out-of-service condition. In this state, the smart meter 162 can communicate with other smart meters in the electric power distribution network as well as with the host computer for relaying system status information to the host computer and, in the opposite direction, providing commands from the host computer to the various smart meters. In addition, placing a voltage detector across and in contact with either first and second conductive flanges 153a and 153b or across third and fourth conductive flanges 153c and 153d will provide a reliable indication of whether electric power is being consumed at the location of the electric meter 162 from an illegal or improper source, with the meter in an out-of-service condition for the purpose of preventing any such unauthorized electric power consumption, commonly known as "backfeeding."

As shown in FIG. 10, an antenna 182 which includes internal resistance 184 is coupled across the first and second plastic jaws 154a and 154b. In this configuration, with the electric meter 162 in and out-of-service condition, the antenna 182 is energized for allowing the electric meter to communicate with other electric meters within the electrical power distribution network, as well as with the network's monitoring/control unit, i.e., host computer, via an RF link.

This invention also contemplates a high-speed, low cost automatic tripping device for clearing a high impedance fault such as, for example, a downed high voltage conductor within a utility power distribution grid and which includes a solenoid and RF receiver in combination with a grounded coiled spring. Responsive to a received direct or remote (RF) signal representing a fault condition, the solenoid releases the coiled spring which is under tension in a latched configuration, with the coiled spring then placed in contact with a conductive brass rod in contact with a fuse cutout through which the high impedance fault is directed. The fuse cutout under the influence of gravity and the coiled spring then moves to a released position, so as to direct the high impedance fault to the high voltage fault clearing circuit, which is in parallel with the downed high voltage conductor, for safely and quickly directing the high impedance fault to a grounded neutral line.

Figure 11:
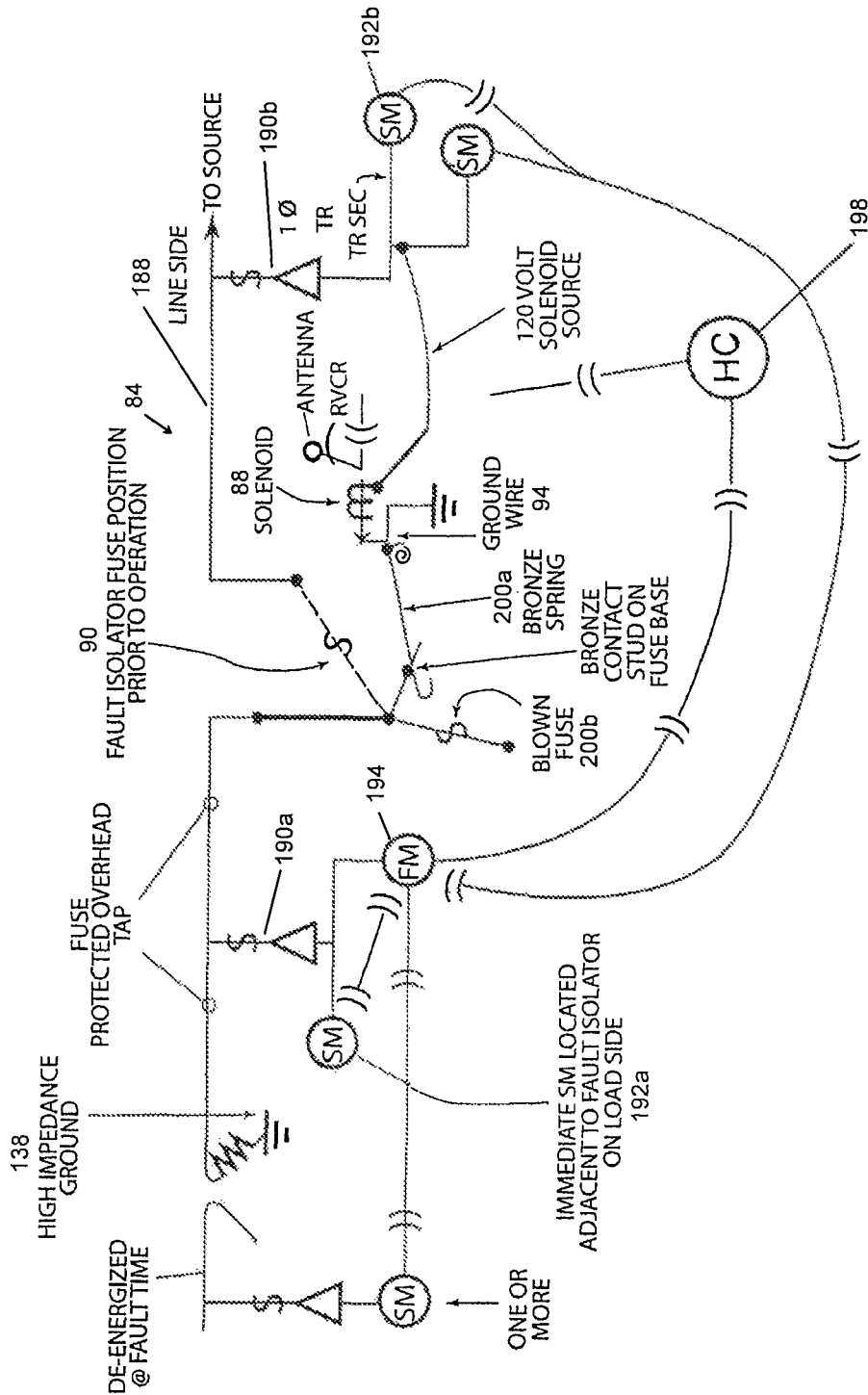
FIG. 11 is a schematic diagram of a circuit incorporating an automatic tripping device for clearing a high impedance fault in an electric power distribution network in accordance with another aspect of the present invention.

Referring to FIG. 11, there is shown a schematic diagram of a circuit incorporating a high speed automatic tripping device 84 for clearing a high impedance fault in an electric power distribution network in accordance with the principles of the present invention. The electric power distribution network includes a line side conductor 188 coupled to a source of high voltage (not shown for simplicity). The electric distribution network further includes a high impedance ground line 138 coupled to neutral ground. One or more first electric power distribution transformers 190a are coupled to the high impedance ground line 186. Similarly, one or more second electric power distribution transformers 190b are coupled to the line side conductor 188. Coupled to each of the first power distribution transformers 190a is a respective first smart meter 192a. Similarly, coupled to each of the second power distribution transformers 190b is a respective second smart meter 192b. Coupled to each power distribution transformer via a respective smart meter is a respective end user, or customer, receiving electric power, which is not shown for simplicity. Also as shown in FIG. 11 is a father smart meter 194 coupled to the first power to distribution transformer 190a, as well as to the first smart meter 192a and to the second smart meter 192b. Father smart meter 194 monitors and controls the operation of the smart meters within the electric power distribution network, including the first and second smart meters 192a and 192b shown in the figure. A more detailed discussion of the operation and interaction of the father smart meter 194 and the first and second smart meters 192a and 192b is provided above. A system host computer 198 is coupled directly to the second smart meter 192b and is coupled to the father smart meter 194 via the second smart meter. Host computer 198 is also coupled to the first smart meter 192a via the father smart meter 194. Automatic tripping device 84 includes a solenoid 88 coupled to a coiled spring 90, with this combination coupled to the line side conductor 188 and to neutral ground potential via a high impedance ground line 138. Host computer 198 monitors and controls the operation of the electrical power distribution network.

The automatic tripping device 84 in the circuit shown in FIG. 11 includes the combination of a solenoid 88 and a coiled spring 90. Solenoid 88 is coupled to the electric distribution system's host computer 198. Solenoid 88 is responsive to receipt of a signal from host computer 198 representing the occurrence of a high impedance fault within the electric power distribution network. Upon the occurrence of a high impedance fault, solenoid 88 moves from a first state, or configuration, to a second state, or configuration, as described below. Solenoid 88 is disposed in physical contact with coiled spring 90. In the absence of a high impedance fault within the electric power distribution network, solenoid 88 is in a first configuration and coiled spring 90 engages a first contact point 200a within the circuit of FIG. 11 in allowing for distribution of electric power throughout the power distribution network for receipt by the network users, or consumers. The occurrence of a high impedance fault within the electric power distribution network causes solenoid 88 to assume a second configuration, and to displace spring 90 from contact with point 200a to contact with point 200b as shown in FIG. 11. In this second configuration, or position, of both solenoid 88 and coiled spring 90, the high impedance fault is directed via the high impedance ground line 138 to a neutral ground. This results in the rapid, safe dissipation of the high impedance fault to a neutral ground as described below.

Figure 12:
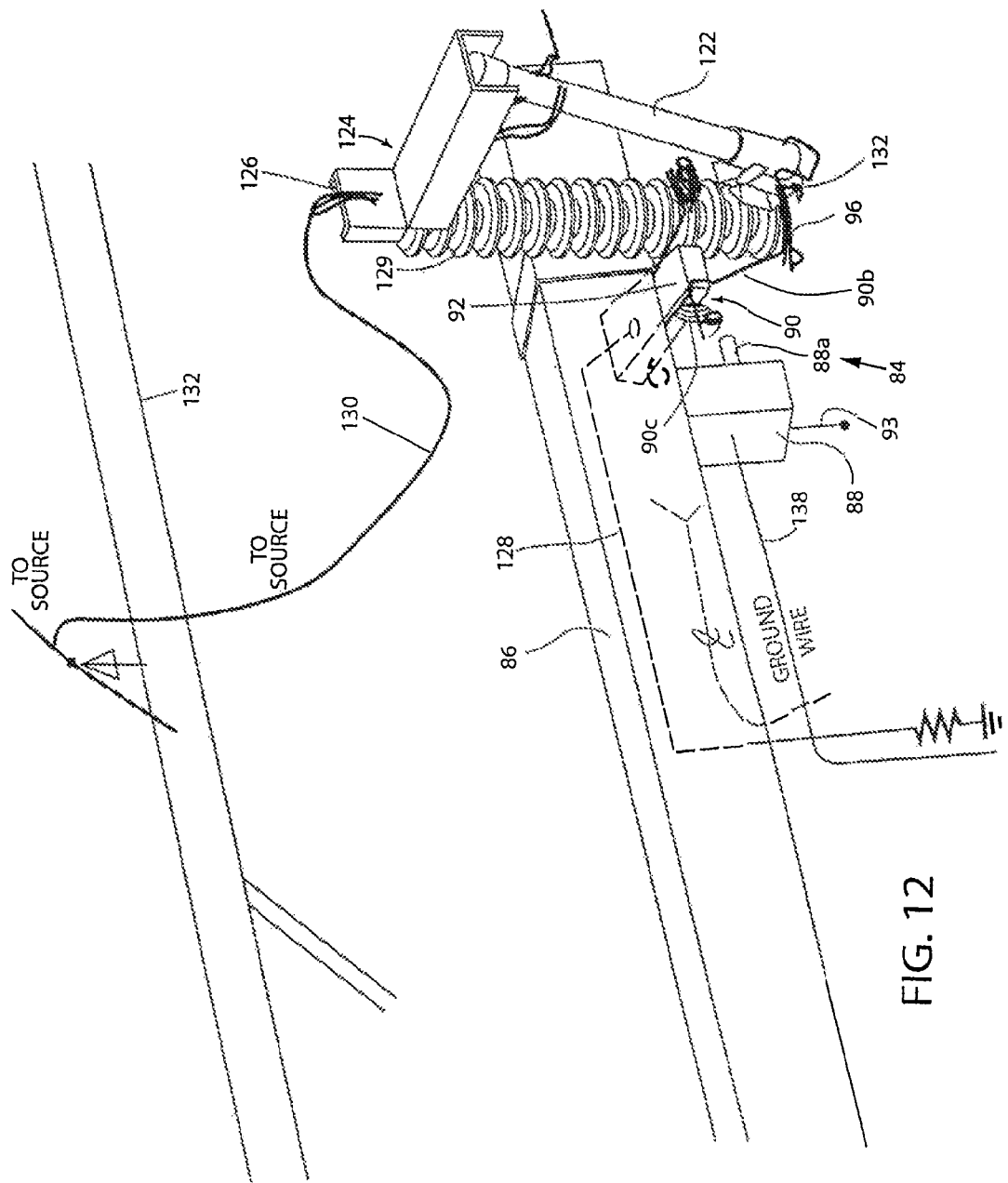

Referring to FIGS. 12 and 13, there are shown perspective views of the automatic tripping device 84 of the present invention. In the embodiment shown in FIGS. 12 and 13, the automatic tripping device 84 is a coupled to and supported by a generally linear structural member 86, although virtual any type of support member may be used to position the automatic tripping device as desired. The automatic tripping device 84, as described above in terms of FIG. 11, includes the combination of a direct or remote controlled solenoid 88 and a coiled spring 90. Solenoid 88 is also attached to the structural member 86 by conventional means such as by a mounting bracket (not shown for simplicity) and includes an arm 88a extending therefrom. Solenoid 88 may be provided with an input control signal from host computer 198 either directly via a signal conductor coupled to the solenoid or remotely by an RF signal provided to the solenoid via an antenna 93. Coiled spring 90 is closely spaced relative to solenoid 88 and includes a center coiled portion 90c portion and a first spring arm 90a and a second spring arm 90b, where the coiled spring has a phosphor bronze composition. The first and second spring arms 90a and 90b are formed integrally with, and extend outwardly in opposing directions from, the spring's center coiled portion. Coiled spring 90 is also securely attached to support member 86 by conventional means such as a mounting bracket 92. The second spring arm 90b is in contact with a conductive brass rod 96. Structural member 86, or overhead pole cross arm, also is coupled to and provides support for a fused expulsion cutout 122 and the combination of solenoid 88 with isolation RF receiver (not shown) and the phosphor bronze coiled spring 90.

Disposed adjacent coiled spring 90 is a generally linear, elongated fused cutout insulator 129 preferably comprised of porcelain. Fused cutout insulator 129 provides insulation for high voltage source conductor 130 during normal operation and is strong enough to electrically isolate components during discharge of a high impedance fault. The high voltage source conductor 130 is coupled to a conductive fuse (not shown) within a fused expulsion cutout 122 by means of the combination of a coupling bracket, or flange, 124 and an electrical connector 126. Pivotally coupled to a lower end portion of the porcelain insulator 129 by means of a hinge 132 is the fused expulsion cutout 122. Fused expulsion cutout 122 is capable of moving between a generally upright position relative to porcelain insulator 129, as shown in FIG. 12, where an upper end of the fuse cutout engages the coupling bracket 124, and a lowered position is shown in FIG. 13. The tubular fused expulsion cutout 122 contains the aforementioned conductive fuse and also includes a powder material (also not shown) for extinguishing the fuse after a high impedance fault is directed to neutral ground as described below. In addition, the fuse which is preferably comprised of silver clears the fault by drawing the arc through the hollow tubular expulsion cutout 122 which contains an arc quenching material for dissipating the arc within the tubular cutout.

Automatic tripping device 84 operates in the following manner. Upon receipt of an RF signal from the electric power distribution network's host computer (not shown) by solenoid 88 via antenna 93 indicating a high impedance fault in the electric power distribution network, the solenoid retracts an arm 88a extending therefrom which is in contact with the coiled spring's first arm 88a. Upon retraction of the solenoid's arm 88a, the tension in coiled spring 90 is released causing the spring's first arm 90a to move downwardly, or in a counterclockwise direction as viewed in FIG. 13 as indicated by arrow 136. Downward movement of the coiled spring's first arm 90a applies ground to the energized fuse cutout 122. The resulting fault current melts the fuse under tension, releasing the cutout 122 from its generally upright position as shown in FIG. 12, allowing the fuse cutout to pivot downwardly under the influence of gravity about hinge 132 to assume an inclined position as viewed in FIG. 13. Disposed within fuse cutout 122 is the aforementioned expulsion fuse which melts, under spring tension. The fuse element is pulled through arc-quenching material within the fuse cutout so as to prevent re-striking of the arc and to quench, or extinguish, the fuse which had been maintained under tension within the fuse cutout. With the solenoid's arm 88a in the extended position so as to maintain coiled spring 90 in a loaded position and under tension, the circuit has a very high impedance. When the coiled spring 90, which is preferably comprised of a highly conductive material such as phosphor bronze, is released and the expulsion fuse is melted, the circuit is shorted out and a high impedance fault is directed to neutral ground via the ground wire 128 coupled to coiled spring 90. This type of electrically conductive spring 90 is used with a fire door sensor. Sensing a potential overheated transformer condition, a neutral ground potential is applied to the high voltage fuse, deenergizing the transformer. The brass rod 96 disposed adjacent the lower end of the fuse cutout 122 forms a ground fault path. As the fuse melts, it falls downwardly after the coiled spring's first arm 90a moves in a downward direction. In the present invention, fuse cutout 122 is limited in interrupting capacitor so as to be capable of conducting up to 10,000 amps, beyond which it could blow up. Tap wire 130 couples the automatic tripping device 84 to the high voltage source 132. Electrical connector 126 couples the source side of the high voltage conductor 130 to the automatic tripping device 84. Tripping device 84 is designed for positioning at or near the upper end of an electric utility pole, with a high impedance line 138 being grounded at a location near the base of the utility pole.

Referring to FIG. 14, there is shown a simplified circuit schematic diagram illustrating the manner in which high voltage is backfed from a common connection of the three single phase transformer arrangement, where the three primary windings of the transformers are respectively identified as elements 133a, 133b and 133c and are disposed in the shape of a "Y" in the figure for simplicity. Each of the three primary windings 133a, 133b and 133c (illustrated in a "WYE" shape) is electromagnetically coupled to a respective one of the secondary windings 134a, 134b and 134c connected in a delta arrangement in the three transformer connection arrangement. In this arrangement, while one phase may be deenergized from the substation source, the two remaining energized phases provide a backfed voltage to neutral ground as shown in FIG. 14. Thus, voltages from the two hot legs 133b and 133c of the three coupled transformers carry a circulating current in secondary windings 134b and 134c, respectively. A fault current $I_{FT}$, where $I_{F1}+I_{F2}=I_{FT}$, is produced in the primary grounded winding 134a and is directed as the high impedance fault to neutral ground potential via high impedance ground line 138 coupled to secondary winding 134a. Three primary winding connections, each coupled to a secondary winding of a respective one of the three transformers, are tied to a common point A in each transformer which is connected to a floating neutral potential 139. Circulating current in the low side delta connection is transformed to the high side winding phase faulted to ground. The transformers increase the impedance due to backfeed.

While particular embodiments of the present invention have been described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper prospective based on the prior art.

The invention claimed is:

1. A tripping mechanism for rapidly and safely directing a high impedance fault in a high voltage conductor to neutral ground, said tripping mechanism comprising:
   a solenoid having an arm movable between a first position and a second position and responsive to a signal representing a high impedance fault;
   an electrically conductive resilient member disposed adjacent said solenoid and engaged and maintained under tension by the solenoid's moveable arm in said first position;
   a hollow tubular member having first and second opposed ends and containing the high voltage fuse and moveable between a third position and a fourth position; and
   an electrically conductive rod having first and second opposed ends, wherein the first end of said rod is in contact with the second end of said tubular member when said tubular member is in said third position;
   wherein when the arm of said solenoid in response to said solenoid receiving a signal representing a high impedance fault moves from said first position to said second position for releasing tension in said resilient member, whereupon said resilient member engages said grounded rod into electrical contact with the high voltage fuse in said tubular member for moving said tubular member from said third position to said fourth position and for directing the high impedance fault via said resilient member to neutral ground potential.

2. The tripping mechanism of claim 1, wherein said resilient member is an electrically conductive spring having a first end portion which is displaced into contact with said electrically conductive rod upon the release in tension of said spring by the solenoid's moveable arm.

3. The tripping mechanism of claim 2, wherein said resilient electrically conductive spring further includes an inner coiled portion and a second end portion, wherein said first and second end portions of said spring extend outwardly in opposed directions from the inner coiled portion of said spring.

4. The tripping mechanism of claim 3, wherein said first end portion of said coiled spring is moved into contact with said electrically conductive resilient member when tension is removed from said spring upon movement of said solenoid's arm from said first position to said second position.

5. The tripping mechanism of claim 4, wherein said resilient conductive member, said fuse element and said electrically conductive rod form in electrical circuit in parallel with the high voltage, conductor for detecting the high impedance fault to neutral ground.

6. The tripping mechanism of claim 1, wherein said resilient member has a silver or copper composition.

7. The tripping mechanism of claim 1, wherein said electrically conductive rod has a brass composition.

8. The tripping mechanism of claim 1 further comprising an insulator coupled to said fuse in said hollow tubular member for providing support for said hollow tubular member.

9. The tripping mechanism of claim 8 further comprising an insulated moveable member coupling said tubular member to said insulator for allowing pivoting movement of said tubular member between said third and fourth positions on said insulator.

10. The tripping mechanism of claim 9 further comprising a coupling bracket engaging an upper portion of said tubular member in a releasable manner to allow said tubular member to move between said third and forth positions.

11. The tripping mechanism of claim 9, wherein said insulator is comprised of porcelain and is generally linear and elongate in shape.

12. The tripping mechanism of claim 1, further comprising an RF receiver coupled to said solenoid for receiving a signal representing a high impedance fault from a remotely located transmitter.

13. The tripping mechanism of claim 11 further comprising an antenna coupled to said solenoid for providing RF high impedance fault signals to said solenoid.

14. The tripping mechanism of claim 1 disposed in an electric power distribution grid and coupled to a computer controller and to plural power distribution transformers.

15. The tripping mechanism of claim 1, wherein said high voltage conductor within said hollow tubular member is in the form of an expulsion fuse adapted for propagation within said hollow tubular member.

16. The tripping mechanism of claim 15, wherein said expulsion fuse melts upon exposure to a high impedance fault.

17. The tripping mechanism of claim 15 further comprising arc quenching material disposed within said hollow tubular member for preventing voltage restrike within said hollow tubular member upon interrupting of a high impedance fault.

18. The tripping mechanism of claim 1, wherein said tubular member moves from said third position to said fourth position under the influence of gravity and spring tension to assume a released position.

\* \* \* \* \*